United States Patent [19]

Czaja et al.

[11] Patent Number: 4,739,780
[45] Date of Patent: Apr. 26, 1988

[54] VERTICAL PHOTORESIST DEVELOPER

[75] Inventors: James J. Czaja; John J. Herrmann, both of Maple Plain, Minn.

[73] Assignee: Circuit Chemistry Corporation, Maple Plain, Minn.

[21] Appl. No.: 941,692

[22] Filed: Dec. 15, 1986

Related U.S. Application Data

[63] Continuation-in-part of Ser. No. 796,933, Dec. 20, 1985, Pat. No. 4,732,173.

[51] Int. Cl.⁴ .............................................. B08B 3/02
[52] U.S. Cl. ........................................ 134/61; 134/94; 134/112 R; 134/131; 134/199
[58] Field of Search .................... 134/61, 64 R, 70, 94, 134/122 R, 131, 199

[56] References Cited

U.S. PATENT DOCUMENTS

| | | | |
|---|---|---|---|
| 3,694,847 | 10/1972 | Hetman et al. | 134/64 R X |
| 4,281,675 | 8/1981 | Pure | 134/199 X |
| 4,452,264 | 6/1984 | Kreisel | 134/199 X |
| 4,506,687 | 3/1985 | Rosch, III | 134/199 X |
| 4,539,069 | 9/1985 | Fishman et al. | 134/72 X |
| 4,561,904 | 12/1985 | Eberhardt, Jr. | 134/57 D |

*Primary Examiner*—Harvey C. Hornsby
*Assistant Examiner*—Frankie L. Stinson
*Attorney, Agent, or Firm*—Hugh D. Jaeger

[57] ABSTRACT

Vertical photoresist developer for processing of any size of printed circuit boards carried on a processing cassette. The processing cassette is carried by a chain through a main chamber, a rinse chamber and a drying chamber, all the processing chambers in line with each other. The processing system is electromechanical and electrically controlled, as well as air and liquid flow control. The developer is system oriented and symmetrical in operation to either side of the board. A printed circuit board holder with gripper fingers mounted in removable plastic chain cassette carries the board through separable processing chambers.

16 Claims, 14 Drawing Sheets

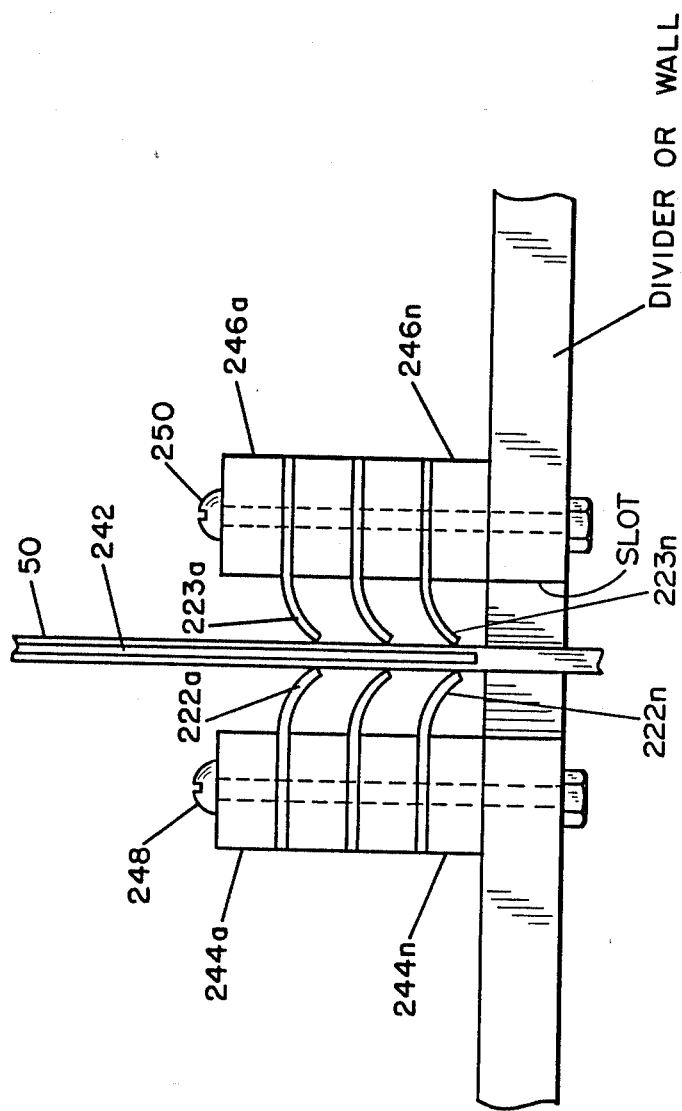

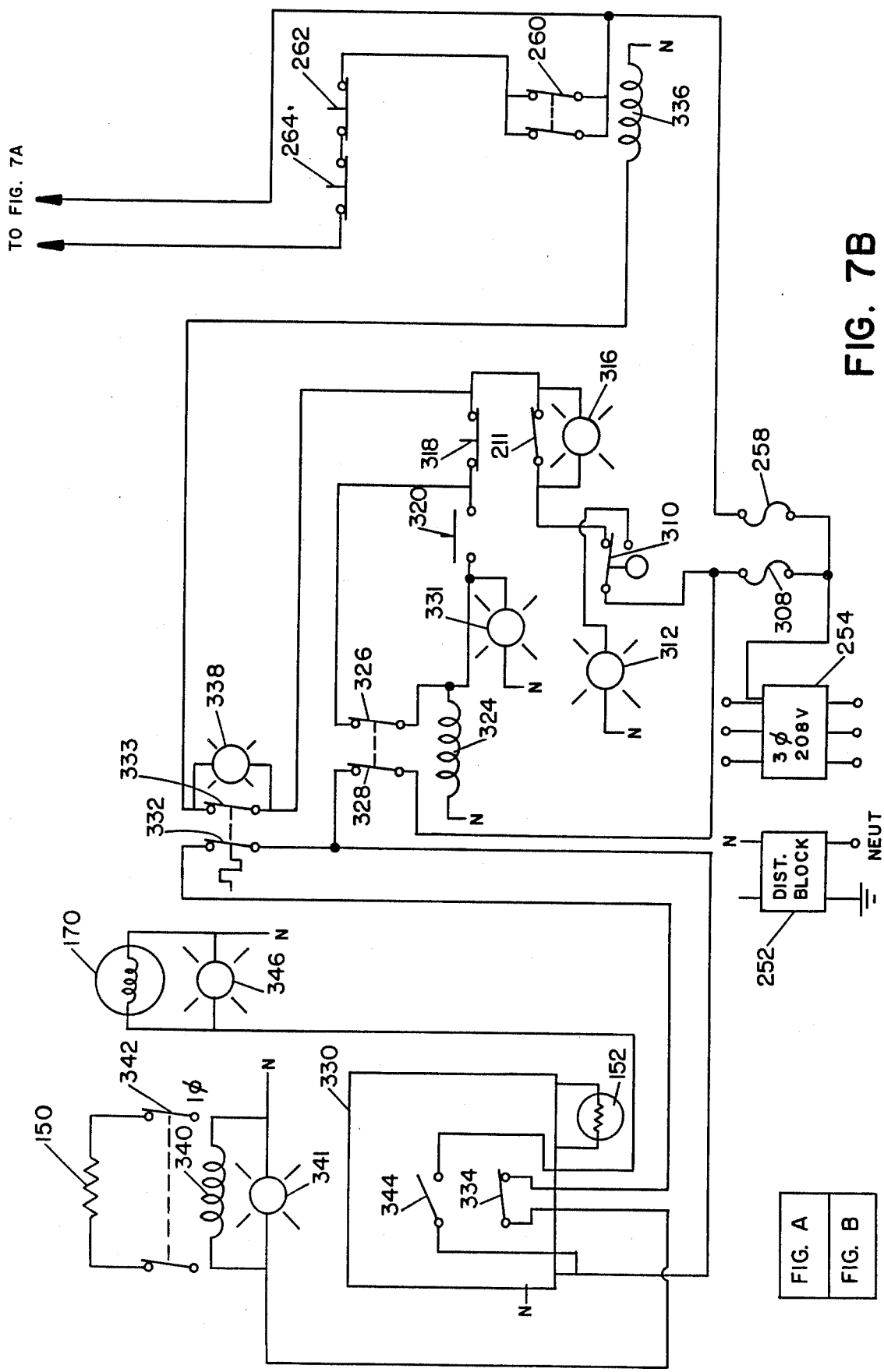

VERTICAL PHOTORESIST DEVELOPER

This is a continuation-in-part of U.S. Ser. No. 796,933, filed Dec. 20, 1985, now U.S. Pat. No. 4,732,173, entitled "Vertical Photoresist Developer, and assigned to the same assignee.

BACKGROUND OF THE INVENTION

1. Field of the Invention

The present invention is a chemical conveyorized processor system for printed circuit boards, and more importantly, pertains to a vertical photoresist developer for printed circuit boards. The system can also function as a vertical solder stripper, photoresist stripper or a vertical etcher for printed circuit boards. A geometrically configured printed circuit board holder with rubber gripper fingers mounted on a non corrosive plastic chain or endless conveyor within a cassette conveyor system carries the boards through the separable processing chambers.

2. Description of the Prior Art

Prior art developer systems for printed circuit boards have not been able to process any size of printed circuit boards on the same piece of equipment. Finally, prior art systems have not always provided for consistent uniform processing of printed circuit boards. Prior art has also suffered from premature wear on the board transport system because of the materials used. Prior art devices have used gear driven exposed pucks and rollers to propel the boards which require excessive maintenance due to exposure to processing chemicals, and poor propelling of parts because of poor contact of the parts to the pucks causing slippage of the parts themselves within the system.

The present invention overcomes the disadvantages of the prior art by providing a system for processing of printed circuit boards.

SUMMARY OF THE INVENTION

The general purpose of the present invention is to provide a non-immersion vertical photoresist developer for the chemical processing of printed circuit ("PC") boards utilizing a controlled and automatic process where a circuit board passes vertically through a plurality of processing chambers.

Another purpose of the present invention is a processing system for uniform processing of printed circuit boards in a system including uniform fluid flow control. Still another purpose of the present invention is a simplified and readily maintained method of securing a circuit board in a holder for processing through the chambers of the developer. Yet another purpose of the present invention is a cassette loaded conveyor system for the carriage of the holder through the processing chambers. Still another purpose of the present invention is a vertical photoresist developer system which separates into a plurality of pieces for ease of transport and assembly.

According to embodiments of the present invention, there is provided a motor driven variable speed conveyor chain which engages an open-center circuit board processing cassette. A printed circuit board fits into the vertical basket open-center vertically aligned cassette and is carried through a series of sealed chambers by a driven chain. After placing the cassette onto a loading slot, the cassette moves into a developer wash chamber. Substantially similar mirror-image dual-spray nozzles vertically aligned spray tubes on each side of the chain conveyor spray processing solution about both sides of the printed circuit board. In a rinse chamber, a rinse solution is applied to both sides of the printed circuit board by substantially similar mirror-image vertically-aligned spray tubes with a plurality of spray nozzles, as well as an overhead spray nozzle for complete and thorough rinsing in the sealed rinse compartment. The printed circuit board is dried by high pressure air knives in the drying chamber before moving into the unload slot. Processing spray fluid is temperature controlled. The motor is variable speed for length of exposure of the printed circuit board through the chambers. Automatic interlocks and emergency stop controls provide for safety of the operator and to the process equipment. Flow control of the fluid is electromechanically and fluid dynamically controlled.

According to alternate embodiments of the present invention, there is provided a geometrically configured printed circuit board holder including a plurality of opposing rubber gripper fingers mounted perpendicularly to each other forming a seating area or pocket. Circuit boards rest in a V area formed by the gripper fingers for carriage through the processing chambers. The printed circuit board holder mounts on a continuous plastic non-corrosive conveyor chain, a series of conveyor chains, or like endless conveyor members. A configured cassette surrounds and encompasses the plurality of the chain mounted circuit board holders for allowing easy removal of the circuit board holders and the chain from the vertical photoresist developer chamber for the purpose of maintenance or substitution of different size printed circuit board holders as required.

According to still another embodiment of the present invention, there is provided a vertical photoresist developer system which is divided into separate processing sections, each section including a conveyor chain cassette and at least one printed circuit board holder therein.

One significant aspect and feature of the present invention is printed circuit board conveyorized processing system.

Another significant aspect and feature of the present invention is a vertical photoresist developer using vertical alignment of the printed circuit board in the processing system.

Another significant aspect and feature of the present invention is a vertical photoresist developer using a variable-speed chain conveyor for engaging a printed circuit board in a cassette engaged on a processing carry through endless chain. This enables small parts to be processed through the machine, so that the chain conveyor has little or no wear characteristics. The system can also pass small parts through the machine.

A further significant aspect and feature of the present invention is a vertical photoresist developer utilizing substantially vertically aligned or unaligned spray tubes in the develop/wash chambers and rinse chambers, as well as a plurality of overhead rinse spray tubes.

Yet, another significant aspect and feature of the present invention is a vertical photoresist developer using high pressure air knives to substantially dry the circuit boards.

Still another significant aspect and feature of the present invention is a vertical photoresist developer which utilizes multiple-membered chamber divider seals to divide the processing chambers from one another.

Yet, still, another significant aspect and feature of the present invention is a vertical photoresist developer utilizing substantially all non-corrosive plastic members for its construction.

Further, another significant aspect and feature of the present invention is a vertical photoresist developer utilizing drop-in style cassette for the carrying of any size of printed circuit board, and especially small ones, for processing through each of the chambers.

Another significant aspect and feature of the present invention is a PC board holder which utilizes opposing rubber gripper fingers mounted on a conveyor chain.

Another significant aspect and feature of the present invention is a conveyor package including a PC board holder and conveyor chain or like endless member for quick and easy removal of the cassette package.

Still another significant aspect and feature of the present invention is a vertical photoresist developer that is divided into sections facilitating ease of handling of the system.

Having thus described embodiments of the present invention, it is one principal object hereof to provide a vertical photoresist developer system that is automatic in operation which carries a printed circuit board in a cassette vertically and automatically through chemical processing chambers.

Another object of the present invention is a printed circuit board processing system for processing any size printed circuit board by a variety of chemicals.

A further object of the present invention is a printed circuit board processing system which provides for electromechanical and flow control of fluids including chemical fluids and air flow for drying.

Further, another object of the present invention is a conveyor mounted PC board holder utilizing rubber gripper fingers for conveyance of a circuit board through the vertical photoresist developer system.

Another object of the present invention is a cassette including a PC board holder and conveyor chain or like endless member.

A further object of the present invention is a physically separable vertical photoresist developer system.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference numerals designate like parts throughout the figures thereof and wherein:

FIG. 6 illustrates a top view of the chamber divider seal;

FIGS. 7A and 7B, by appropriate matched lines, illustrate the electrical control schematic for the vertical photoresist developer system;

DESCRIPTION OF THE PREFERRED EMBODIMENTS

Figure 1:
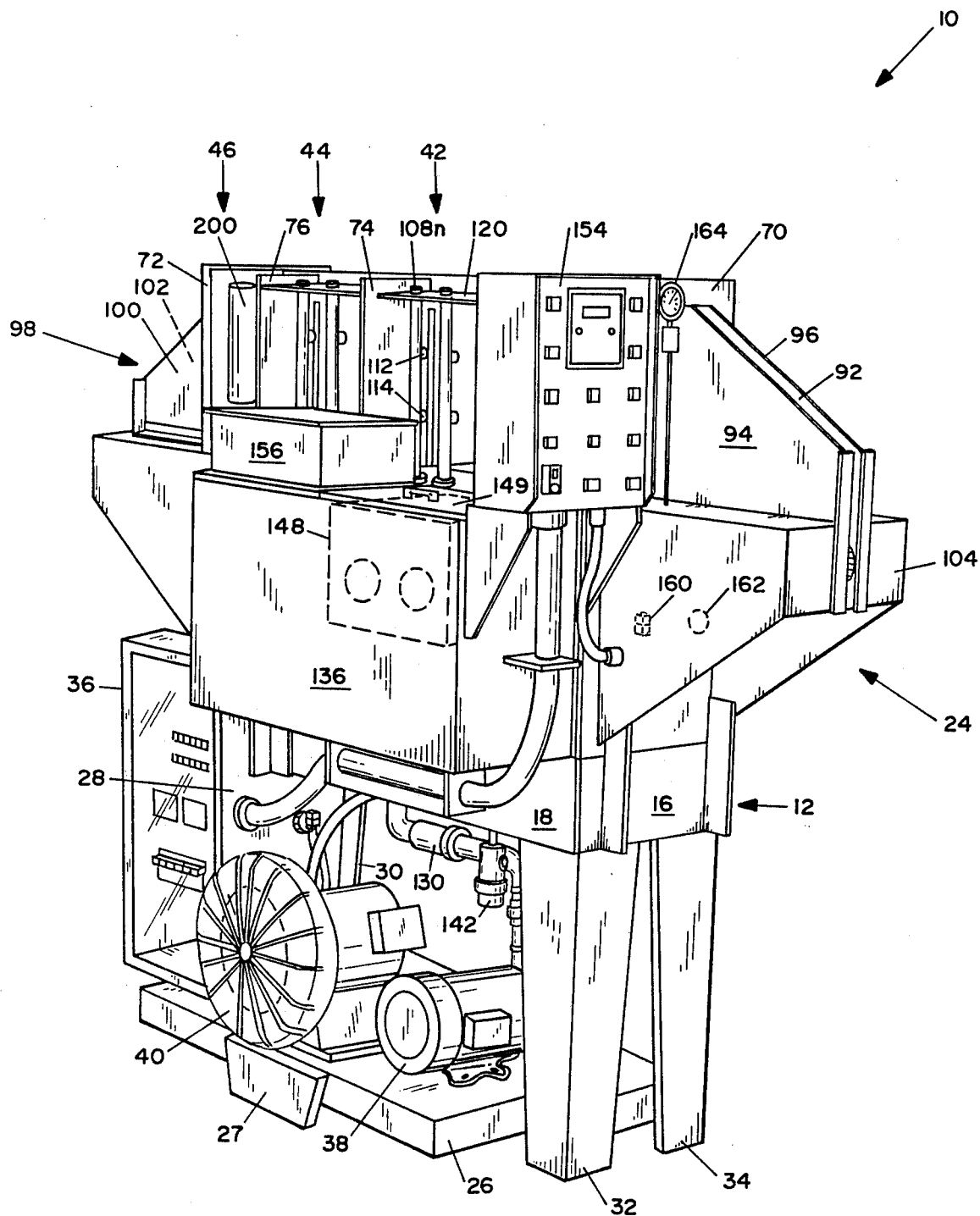
FIG. 1 illustrates a perspective view showing the left and front sides of a vertical photoresist developer system, the present invention.
Figure 2:
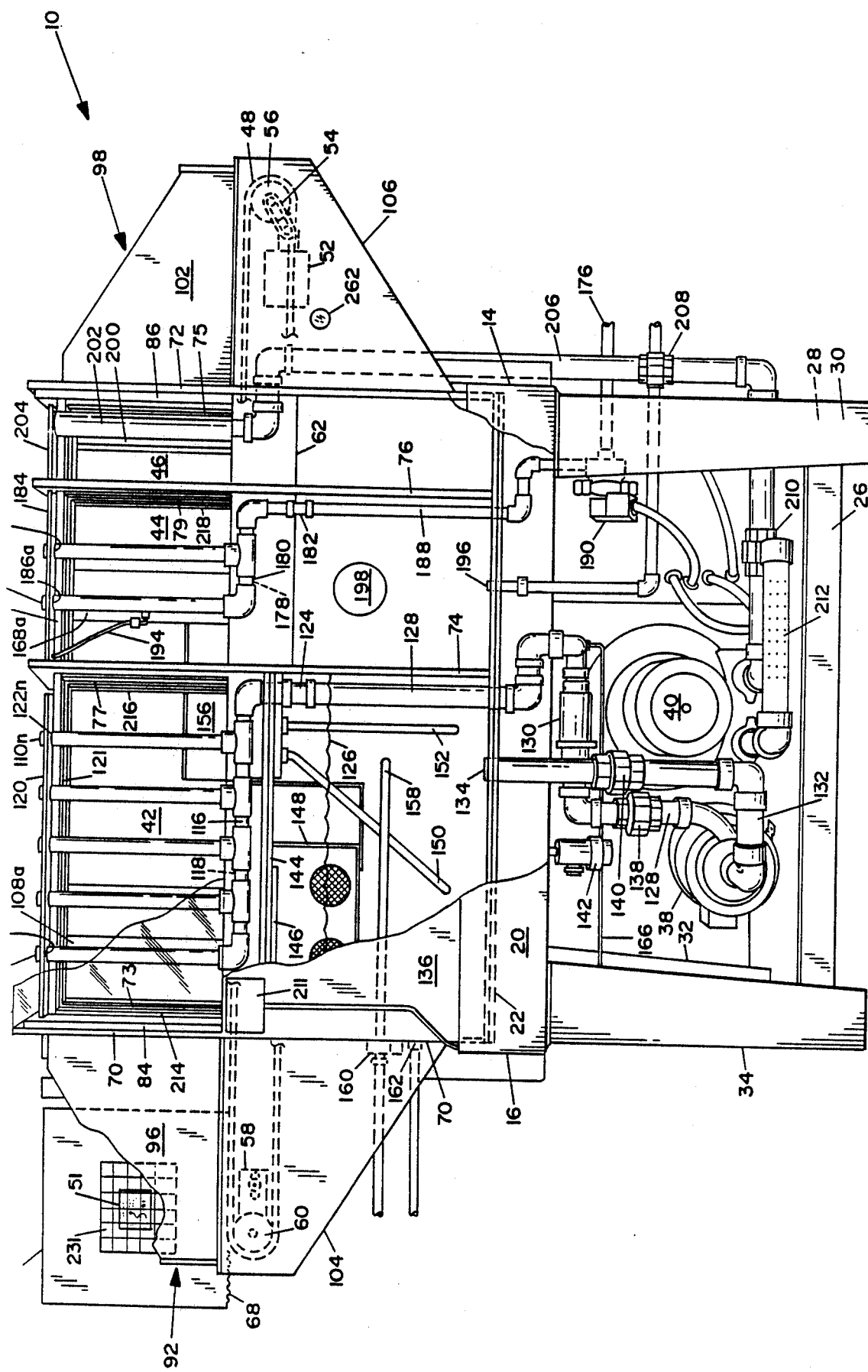
FIG. 2 illustrates a right side view of the vertical photoresist developer system.
Figure 3:
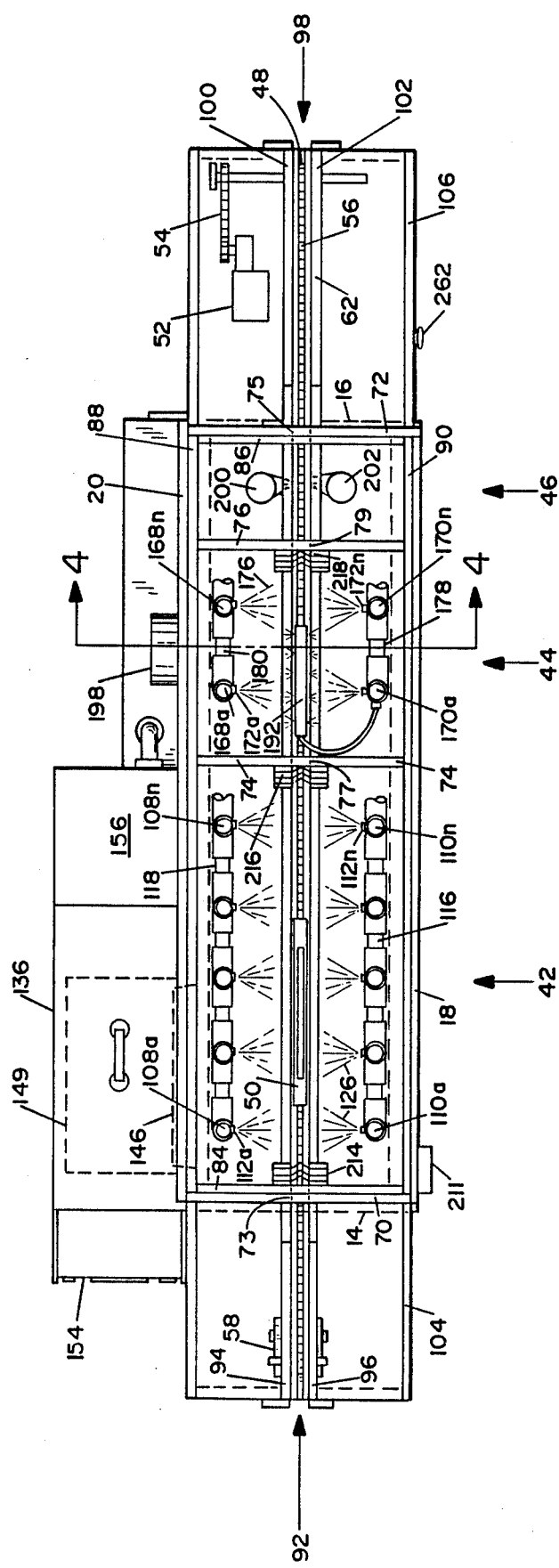
FIG. 3 illustrates a top view of the vertical photoresist developer system with top tube supports and cover removed.
Figure 4:
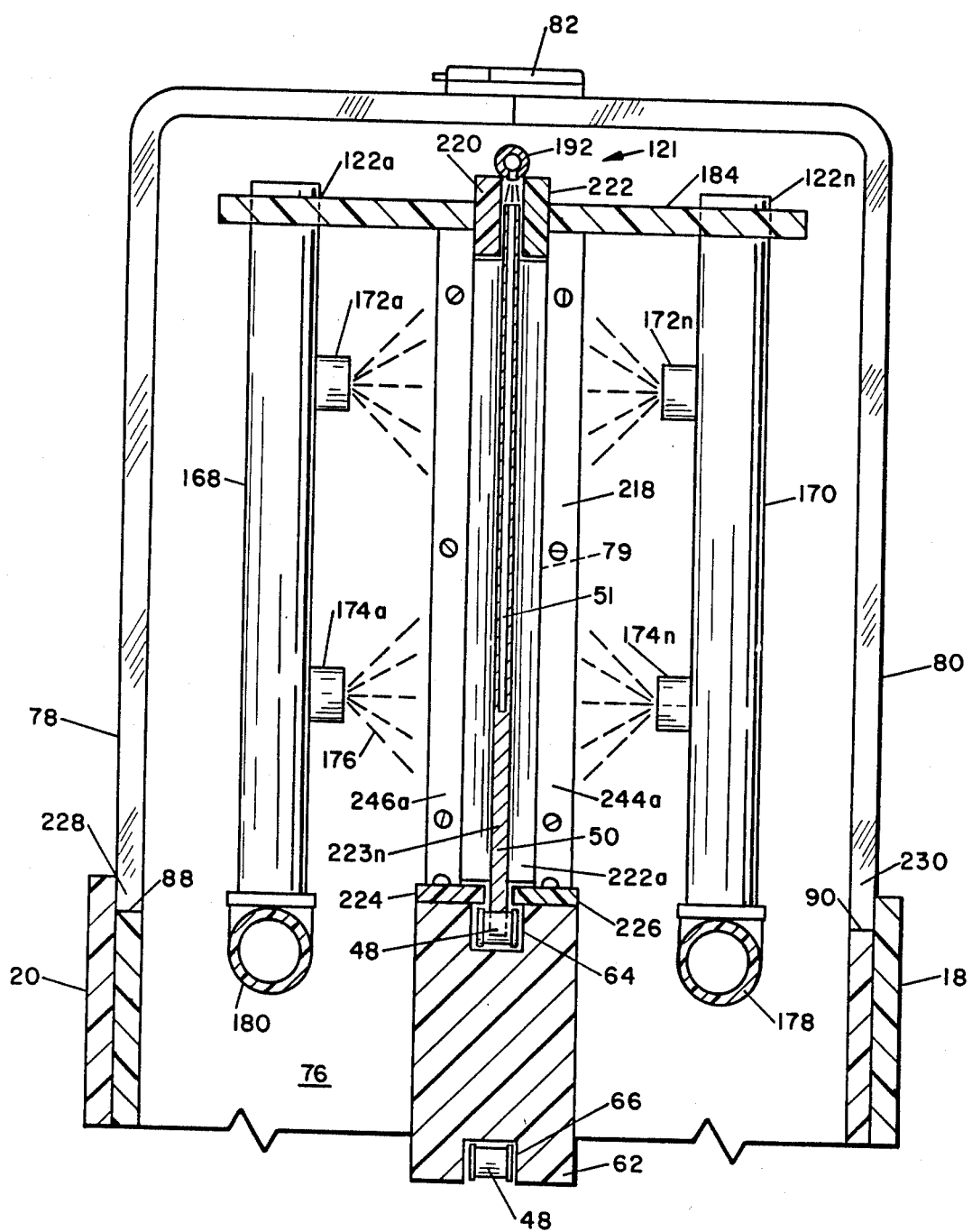
FIG. 4 illustrates a typical cross section taken along line 4—4 of FIG. 3 of the rinse chamber which is also typical of the develop or wash chamber.

FIG. 1 illustrates a perspective view of a vertical photoresist developer 10, as also illustrated in FIGS. 2, 3, and 4. The developer includes a four-legged rectangular stand 12 with opposing ends 14 and 16, two opposing sides 18 and 20, bottom 22, and upper support member 24 engaging and fitting within ends 14, 16, sides 18 and 20, and resting upon the bottom 22 of the rectangular stand 12. A motor base 26 with an additional support leg 27 secures between four legs 28, 30, 32 and 34 of stand 12. A control relay rack 36 mounts adjacent to leg 28 of the stand 12, and above the rear portion of the motor base 26. A developer pump 38, also referred to as the wash pump, and an air blower 40, as well as other components mount, on motor base 26. The components are plumbed within upper body member 24 as discussed later in detail.

Figure 5:
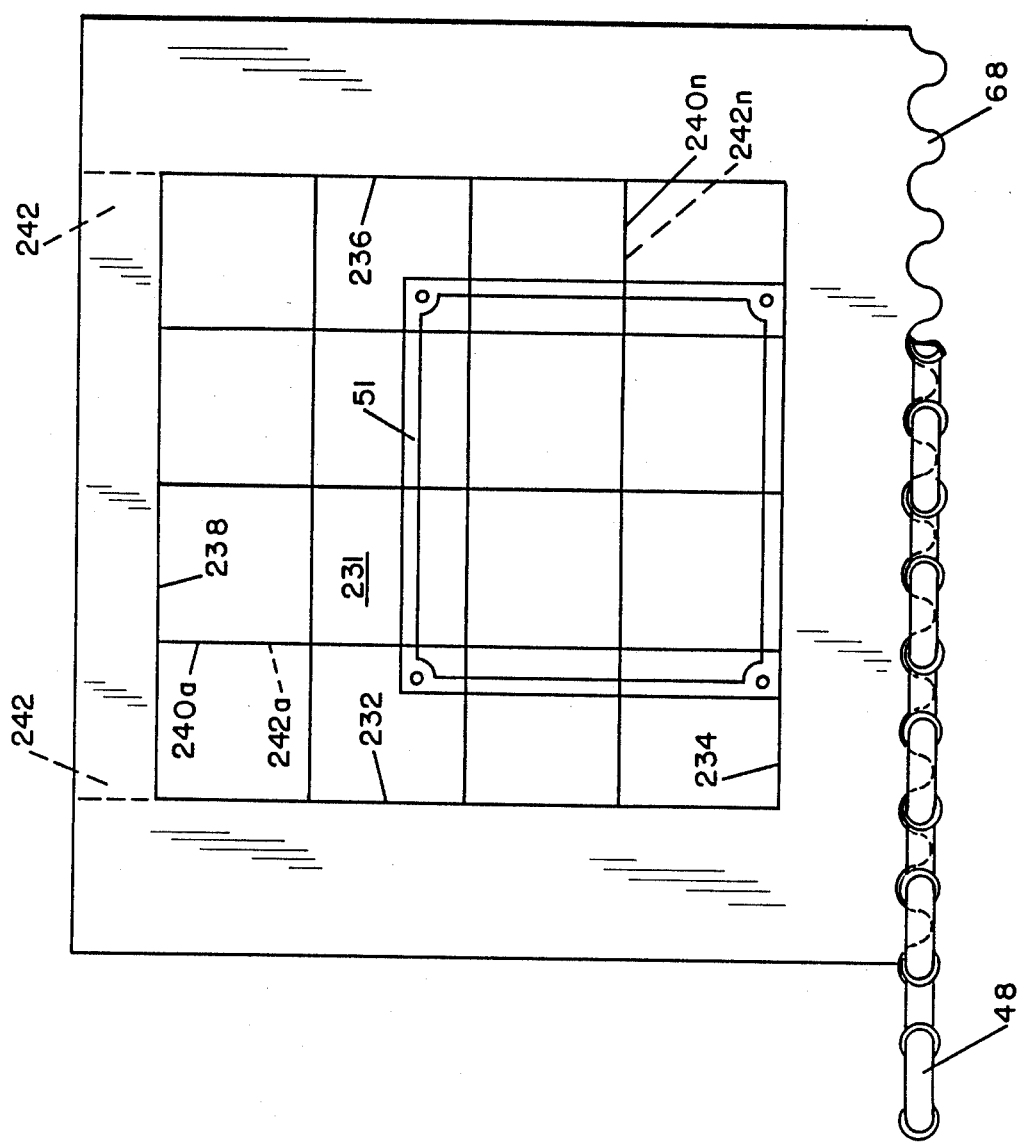
FIG. 5 illustrates a side view of a printed circuit board engaged within the toothed carrier.

Upper support member 24 includes developer chamber 42, also referred to as a wash chamber, a rinse chamber 44, and a drying chamber 46 through all of which a conveyor chain 48 carries a plurality of stainless steel or plastic processing cassettes 50a–50n. A variable speed conveyor drive motor 52 and intermediate drive chain 54, as depicted in FIGS. 2 and 3, drive a sprocket 56 and conveyor chain 48. An adjustable sprocket adjusting plate 58 positions adjust sprocket 60 to tighten and tension conveyor chain 48 properly. A chain guide 62 with longitudinal upper and lower slots 64 and 66 position and guide the chain between sprockets 56 and 60 through wash, rinse and dry chambers 42, 44, and 46, as also shown in FIGS 2, 3, and 4. The processing cassette 50, as also shown in FIG. 5, utilizes a plurality of teeth 68 along the lower edge to engage links of the conveyor chain 48 for passage there upon and through the chambers 43, 44, and 46. End walls 70 and 72, with vertical passage slots 73 and 75, position at the ends of the develop chamber 42 and drying chamber 46, respectively. Divider wall 74 with a vertical passage slot 77 positions between the develop chamber 42 and the rinse chamber 44, and divider wall 76 with a vent passage slot 79 positions between the rinse chamber 44 and the dryer chamber 46, as also shown in FIGS. 2 and 3.

A two-section transparent substantially U-shaped cover, as shown in FIGS. 2 and 4, including mirror like opposing sides 78 and 80 and a plurality of cover snaps 82 position over end seals 84 and 86 of FIG. 2 and side grooves 88 and 90 of FIG. 4 to provide a water and air tight seal over and about the chamber areas 42-46. Cassette loading slot 92 formed by slot walls 94 and 96 position at the front of the upper support member 24 for initial vertical alignment of the processing cassettes 50 for conveyance by chain 48 through the chambers 42-46. An unloading slot 98 at the rear of the upper support member 24 is similarly formed by slot walls 100 and 102. Load slot 92 and sprocket 56, shown also in FIGS. 2 and 3, are supported by end support member 104 which secures to the end wall 70. Unload slot 98, sprocket 56 and the variable speed drive motor 52 are supported by support member 106 which secures to end wall 72. Almost all panels, pipes, tubes, tanks, supports, and other elements are constructed of heavy wall plastic members to preclude corrosion or rusting by any chemical or other solutions used in the vertical photoresist developer.

FIG. 2 illustrates a right side view of the vertical photoresist developer where all numerals correspond to those elements previously described. In the wash chamber 42, a plurality of left and right develop, or wash tubes 108a-108n and 110a-110n, respectively, with upper and lower inwardly facing vertical spray pattern nozzles 112a-112n position and align upon the upper portion of left and right develop tubes 108a-108n and 110a-110n. Lower vertical spray pattern nozzles 114a-114n position on the lower portion of the left and right develop tubes 108a-108n and 110a-110n although more wash tubes can be utilized and this is not construed to be limiting or restrictive in the scope.

The right wash tubes 110a-110n and the left wash tubes 108a-108n are manifolded to themselves by right manifold 116 and left manifold 118 respectively. A planar support member 120 with a plurality of positioning holes 122a-122n fits between the end wall 70 and divider 74, and supports and positions the top ends of wash tubes 108a-108n and 110a-110n. A continuous upper cassette guide track 121 is positioned along support member 120 and along support members 184 and 204, and position between end walls 70 and 72. Left and right wash manifolds 116 and 118 are manifolded together by a cross manifold 124, and are fed wash or develop solutions 126 through pressure pipe system 128, adjustable pressure valve 130 and fluid pump 28 which recycles develop solution through fluid return pipe 132 and orifice 134 positioned at the bottom of rectangular fluid tank 136. Unions 138 and 140 are utilized for ease of maintenance of the pump system. A sump drain 142 is located at the tank bottom 136 for drainage of develop solution 126. A baffle 144 with drain scupper 146 positions in the bottom of wash chamber 42 to direct and drain develop fluid 126 into a removable screened particle filter box 148 for filtering of develop/wash fluid 126 prior to its return to the tank 136. A handled tank cover 149 positions over the tank for ready removal and servicing of filter box 148. Solution heater tube 150 and a solution temp/overheat sensor tube 152, both controlled by control panel 154, position below a junction box 156. Solution cooling loop 158, with a cooling water inlet solenoid valve 160 and cooling water outlet port 162 mount on end wall 70, within the confines of end support member 104, positions within tank 136 and is likewise controlled through control panel 154. Wash system pressure is sensed in pressure pipe system 128 and is transmitted to pressure gauge 164 of FIG. 1 by small pipe 166.

In rinse chamber 44, a plurality of left and right rinse tubes 168 and 170, respectively, with inwardly facing upper vertical spray pattern nozzles 172a-172n, position on the upper portion of rinse tubes 168a-168n and 170a-170n. Inwardly facing lower vertical spray pattern nozzles 174a-174n position on the lower portion of rinse tubes 168a-168n and 170a-170n, as also illustrated in FIG. 4, for rinsing by water 176 or other rinse solution of develop solution 126 from the cassette 50 and printed circuit board 52 as such pass through rinse chamber 44 although more rinse tubes can be used. The right rinse tubes 170a-170n and the left rinse tubes 168a-168n are manifolded to themselves by right and left rinse manifolds 178 and 180, respectively. Left and right rinse manifolds 178 and 180 are connected together by cross manifold 182. A planar support member 184 with a plurality of positioning holes 186a-186n fits between divider walls 74 and 76, and support and position the upper ends of rinse tubes 168a-168n and 170a-170n. The continuous cassette top guide track 121 is positioned along planar support member 184 which is further described later in FIG. 4. The rinse tubes 168a-168n and 170a-170n are fed water 176 or other rinse solution from their respective manifolds 180 and 178, cross manifold 182, and rinse pipe 188 through inlet solenoid valve 190. The solenoid valve 190 being controlled through control panel 54. An overhead rinse tube 192, as also shown in FIG. 3, positions on top of the upper cassette guide track 121 to insure proper rinse action at the top portion of the cassette 50, and receives rinse water or solution from right rinse tube 170a and small pipe 194. Rinse water or solution 176 exits the rinse chamber 44 through drain orifice 196 to a common drain or external rinse container. A vent 198 is installed in the side of the rinse chamber 44 in order to draw off any undesired fumes or other vapors, and for venting to the outside.

Inwardly facing left and right air knife dryers 200 and 202 position in drying chamber 46 to force air at a high velocity over the cassette 50 and printed circuit board 52 as such pass through the drying chamber 46. A planar support member 204 fits between divider 76 and end wall 72 for support and alignment of the upper regions of air knife dryers 200 and 202, and also as support for the upper cassette guide track 121. Both air knife dryers 200 and 202 are pressurized through air dry tube 206, unions 208 and 210, dryer blower 40 and perforated air intake tube 212. A safety switch 211 interrupts all power to the conveyor motor 52, pump 38 and dryer blower 40, rinse solenoid valve 190 and conveyor motor 52 in the event the cover halves are not installed or are removed. An emergency stop switch 213 interrupts all power to the conveyor motor 52, the pump 38 and the air blower 40 and the rinse solenoid valve 190 should an individual desire to halt operation of the photoresist developer for whatever reason.

FIG. 3 illustrates a top view of the vertical photoresist developer with tube and dryer top supports 120, 184 and 204 and cover halves 78 and 80 removed, where all numerals correspond to those elements previously described. Particularly noted is the conveyor chain 48 within the chain guide 62 running the full length of the upper body member 24. Also shown is the placement of chamber divider seals 214, 216, and 218, which are further illustrated in detail in FIGS. 4 and 6. Also shown is the overhead rinse tube 192, as well as other previously described components within chambers 42-46.

FIG. 4 illustrates a typical cross section taken along line 4—4 of FIG. 3 of the rinse chamber 44 which is also typical of the develop/wash chamber 42, where all numerals correspond to those elements previously described. Shown in particular is the upper cassette guide track 121 with two vertically aligned opposing members 220 and 222 which position longitudinally between end walls 70 and 72, and through chambers 42-46 for guidance of the top portion of a cassette 50 through the chambers. Teeth 68 are engaged within conveyor chain 48 for passage of the cassette 50 through chambers 42-46. Chamber divider seal 218 is shown mounted over and about the vertical slot 79 with its plurality of opposing flexible mylar wiper gaskets 222a and 223a for complete separation of the chambers during the time the cassette 50 moves from one chamber to another, and also when the cassette has passed completely through all cycles and the machine has not yet been deactivated. Upper chain guide horizontally aligned members 224 and 226 are affixed upon the chain guide 62 with appropriate hardware for initial alignment and centering of the cassette 50 within the conveyor chain 48. The lower ends 228 and 230 of cover halves 78 and 80 engage within slots 88 and 90, and against end wall gaskets 84 and 86 affecting a water proof seal of the chambers 42-46. Positioning of the rinse tubes 168 and 170 is shown with reference to the planar support member 184 and the chain guide 62. Planar member 184 is positioned between divider wall 76 and divider wall 74. Develop tubes 108a-108n and 110a-110n in chamber 42 are similarly positioned.

FIG. 5 illustrates a side view of a printed circuit board 51 engaged within the toothed or untoothed stainless steel or plastic carrier 50 where all numerals correspond to those previously described. An open pocket 231 is formed by interior edges 232, 234, 236 and 238, and horizontal and vertical monofilament plastic aligned cord pairs 240a-240n and 242-242n, similar to fishing line, which are fixed vertically and horizontally across edges 232-238. The printed circuit board 51, to be processed, has across to the open pocket 231 through elongated slot 242 through edge 238. The printed circuit board 52 is removed from the carrier by simply inverting the cassette unit 50 so that the printed circuit board may slide from the open pocket 231 through the elongated slot 242. Shown in particular in this illustration is the fitting of the plurality of cassette teeth 68 into the links of the conveyor chain 48, each of which can be fashioned of non-corrosive stainless steel or high tensile plastic.

FIG. 6 illustrates a top view of the chamber divider seal where all numerals correspond to those previously described. Pairs of flexible mylar wiper gasket seals 222a-222n and 223a-223n position between a plurality of separation blocks 244a-244n and 246a-246n, respectively, in stacked fashion and secure adjacent and over a vertical divider or end wall slot area by the use of nut and bolt assemblies 248 and 250. The flexible mylar wiper gaskets seals 222a-222n and 223a-223n overlap when a cassette is not passing through the slot and form a seal between any two chambers during cassette passage, as well as a wiping and sealing action as the cassette passes from chamber to chamber or from the loading end 92 into wash chamber 42.

Figure 7A:
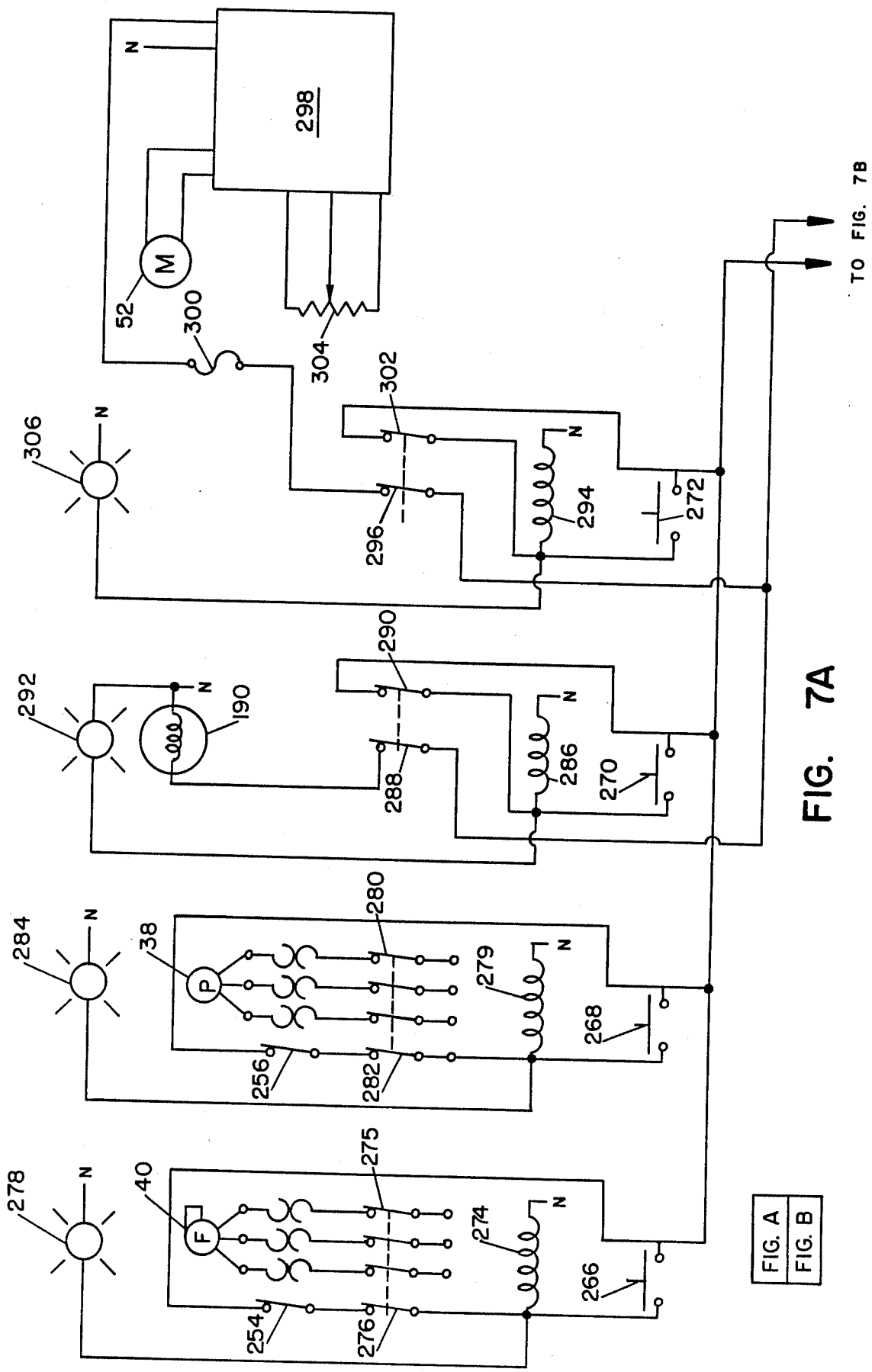

FIGS. 7A and 7B, with matched lines, illustrate the electrical control schematic for vertical photoresist developer.

FIG. 7A illustrates the electrical control schematic for the conveyor, rinse, wash and dry functions, and FIG. 7B illustrates the temperature control and emergency control electrical systems schematic. Single phase AC tapped from a three-phase distribution bus 254, using distributor block 242 for neutral and ground temperatures and motor speed control, is used for control power of various relays, while a three-phase AC distribution bus 254 powers high load items as the dryer blower 40 and the wash pump 38 which are afforded circuit protection through circuit overload contractors 254 and 256. The circuits are shown in full and normal operating condition with tank heat being powered. Combination push switches with independently wired corresponding annunciator lights are used on control panel 154. Power to elements in FIG. 7A is supplied through a fuse 258, interlock relay contacts 260, external emergency stop switch 262, which is in series with stop switch 264, to start switches 266, 268, 270 and 272. Start switch 266 energizes the dryer blower holding coil 274. The dryer blower multiple relay power contacts 275 apply power to the dryer blower 40, and the blower relay holding contacts 276. An annunciator light 278 indicates energizing of the blower relay coil 274 and hence operation of the dryer blower 40. Start switch 268 energizes the pump holding coil 278. Pump relay multiple power contacts 280 apply power to the pump 381, and the pump relay holding contacts 282. An annunciator light 284 indicates energizing of the pump relay coil 279 and home operation of the pump 38. Start switch 270 energizes the rinse holding coil 286. The rinse solenoid relay power contacts 288 apply power directly from the fuse 258 line to the rinse valve solenoid 190, and the rinse solenoid holding contacts 290. An annunciator light 292 indicates energizing of the rinse relay coil 286 and hence operation of the rinse solenoid valve 190. Start switch 272 energizes the conveyor holding coil 294. The conveyor relay power contacts 296 apply power to the motor speed control 298 directly from the fused 268 line through fuse 300, and to the conveyor motor holding contact 302. A speed control adjustment potentiometer 304 controls the speed of the conveyor motor 52 through speed control 298. An annunciator light 306 indicates energizing of the conveyor power relay coil 294 and hence operation of the conveyor motor 52. Actuation of normally closed switch 264 or the control panel 154 or the normally closed emergency stop button 262 located on the side of the end support member 106, or the opening of the interlock relay contacts 260, will cease operation of fan blower 40, pump 38, rinse solenoid 190 and conveyor motor 52 due to interruption of actuating power to respective relay coils 274, 279, 286, and 294.

FIG. 7B illustrates the temperature control and emergency control electrical schematics. Single phase AC power powers the sytem through a fuse 308, a low level switch 310 and accompanying low level annunciator light 312, a cover open switch 211 and accompanying cover open annunciator light 316, temperature control off switch 318 and temperature control on switch 320 with accompanying temperature control on annunciator light 331. Temperature control on switch 320 activates the temperature control holding coil 324, the temperature control holding contacts 326 and the temperature control relay power contacts 328 which delivers power to the temperature controller 330 through temperature control power contacts 328 and also delivers power through over temperature sensing contacts 332. Contacts 332 will open in case of an over temperature thus removing power to the heat relay contacts 334 of temperature control 330 and removing power through over temperature sense contacts 333, to the interlock holding relay coil 336 to interrupt power to relay coils 274, 279, 286, and 294, ceasing operation of the dry blower 40, pump 38, rinse solenoid 190 and conveyor motor 52. An over temperature annunciator light 338 illuminates when the over temperature sensor contacts 332 and 333 are opened. The opening of the low level switch contacts 310 or the cover open contacts 211 will also interrupt power to the interlock holding coil 336 thereby causing power to be interrupted to the dryer blower 40, pump 38, solenoid valve 190 and the conveyor motor 52, and also turning off power to the temperature controller 330 and its associated components through deactivation of temperature control holding coil 324 and temperature control relay power contacts 328. The heat relay 334 in temperature controller 330 applies power to the heater rod element relay coil 340 for actuation of the heater element rod 150 through heater rod power contacts 342, and also illuminates the heater annunciator light 341 when the tank sensor 152 inputs the temperature controller 330 to call for a develop solution 126 temperature increase. When develop solution 126 cooling is called for, tank sensor 152 inputs the temperature controller 330 to close cooling relay 344 applying power to the cooling water solenoid valve 190 and illuminating the cooling annunciator light 346. The interlock holding relay contacts cannot be actuated, unless the low level switch 310 is closed, the cover is on and the cover switch 211 is closed and the over temperature control contacts 332 are closed thus providing for safe operation and proper action.

Figure 8:
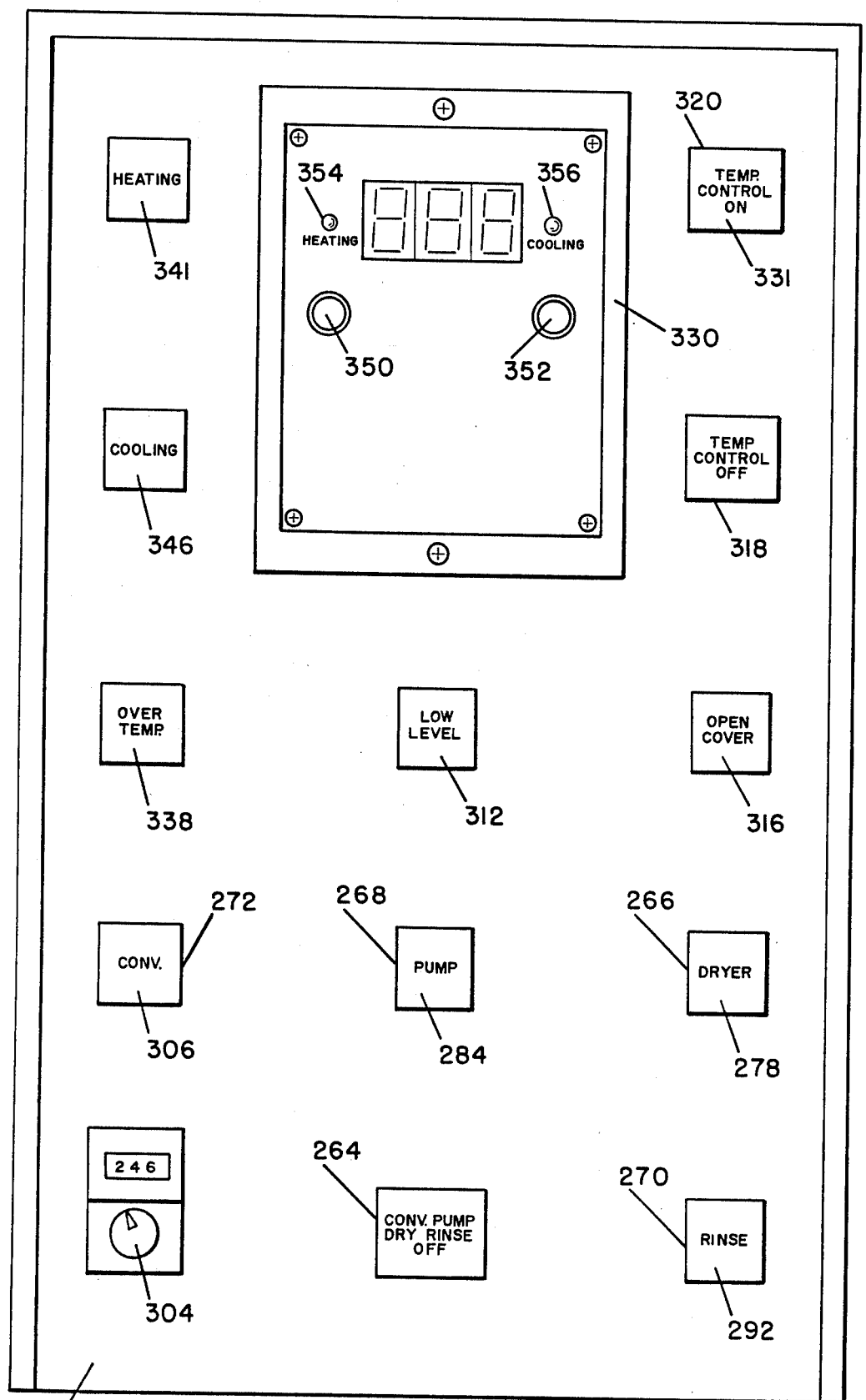
FIG. 8 illustrates the control panel for the vertical photoresist developer system.

FIG. 8 illustrates the control panel face illustration. In particular, the digital temperature control 348 readout and temperature set controls 350 and 352, and temperature control internal LED annunciators 354 for cooling and 356 for heating are illustrated. All other numerals correspond to those elements previously described.

MODE OF OPERATION

FIG. 2 illustrates the vertical photoresist developer 10, the present invention, as one figure setting forth operation of the present invention. The processing cassette 50 with a printed circuit board 51 contained therein, passes through the developer/wash chamber 42, rinsing chamber 44 and drying chamber 46. The cassette 50 engages and fits within the open pocket 231 of cassette 50. The teeth 68 of the cassette 50 engage within the conveyor chain 48 links when the cassette is loaded in loading slot 92. The variable-speed drive motor 52 drives the endless conveyor chain 48 and the cassette 50 engaged therein with the board through the load slot 48, developer/wash chamber 42, rinse chamber 44, drying chamber 46, to the unload slot 98. Dual-nozzle vertically-stationed opposing wash tubes 108a–108n and 110a–110n spray chemical processing solution 126 flow upon both sides of the cassette 50 and circuit board 51 as passed within develop/wash chamber 42. Pump 38 provides for pressurization of the processing solution 126 through pressure pipe 128 and through manifolds 116 and 118 for spraying from vertically aligned wash tubes 108a–108n and 110a–110n. A temperature and overheat sensor 152 positions in the tank 136 to monitor develop solution 126 temperature for subsequent automatically applied heating or cooling through heater tube element 150 or cooling loop 158, respectively, as controlled by a digital temperature controller 330 and associated components in control panel 154 as described, although the use of any other type of temperature controller may be utilized. The developer/wash chamber 42 is sealed from the load slot 92 and the rinse chamber 44 by seal 214, and from the rinse chamber 44 by seal 216, which positions about vertical slots 73 and 77. As the cassette 50 with contents pass into the rinse chamber 44, water on other rinse solution 176 is sprayed upon both sides of the cassette and the board by dual opposing rinse spray nozzles 168a–168n and 170a–170n. A top rinse spray nozzle 192 fixed over the top of the upper track guide 121 sprays the cassetts 50 and the board from above for complete rinse spraying. Rinse solution 176 enters through inlet solenoid valve 190 and exits through drain 196 located at the bottom of rinse chamber 44. Rinse chamber 44 is sealed on both ends by seals 216 and 218 located on divider walls 74 and 76, respectively. After passing through rinse chamber 44, the cassette and board traverses through dryer chamber 46. Dryer blower 40 provides high pressure air to vertically aligned opposing air knives 200 and 202 for air blasting and drying of the cassette 50 and the board. After drying, the cassette enters the unload slot 98 where the board and cassette can be removed by operating personnel. Activation of the conveyor switch 272, pump switch 268, dryer switch 266, and rinse switch 270, as illustrated in FIG. 8, will turn on each unit individually. Activation of switch 264, labeled "CONV. PUMP DRY RINSE OFF", or emergency shutoff switch 262 will turn off the conveyor motor 52, rinse solenoid 292, pump 38 and dryer blower 40 simultaneously. Activation of the "TEMP CONTROL OFF" switch 318 on the front panel will remove power to the temperature control 330, heater element 150, and cooling solenoid 190. Annunciator warnings of an "OVERTEMP" annunciator 338, "LOW LEVEL" annunciator 312, or the "OPEN COVER" annunciator 316, which are activated by overtemp contacts 333, low level contacts 310 or cover open contacts 316, respectively, indicate total shut down of the system including those controlled by the "TEMP ON" switch 320 and "CONV. PUMP DRY RINSE OFF" switch 264, including all temperature sensing and regulating functions, motor, blower or spraying functions. The cover open contacts 316 in the open position provide for operator protection should an individual start any functions without the cover in its proper position.

FIRST ALTERNATIVE EMBODIMENT

Figure 9:
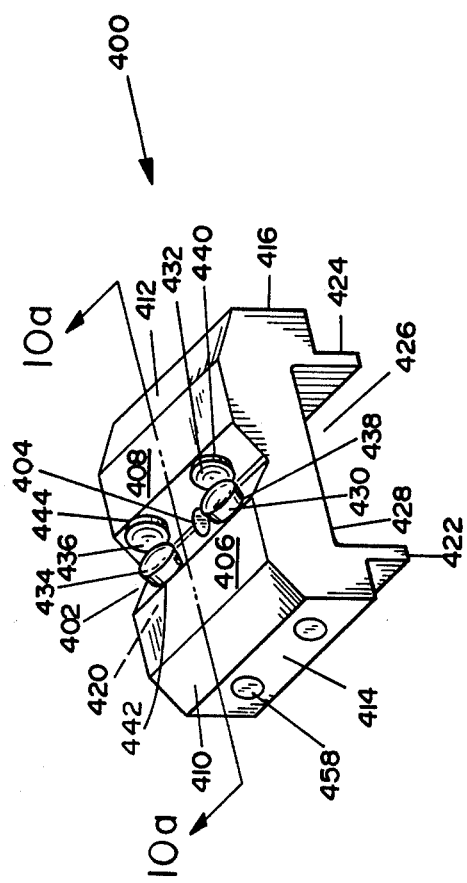
FIG. 9 illustrates a perspective view of a printed circuit board holder, an alternative embodiment of the present invention.

FIG. 9 illustrates a first alternative embodiment of a perspective view of a geometrically configured printed circuit ("PC") board holder 400 including a V groove 402, a drain hole 404 positioned in the apex of groove 402, planar top surfaces 406 and 408, ramped edge surfaces 410 and 412, vertical surfaces 414 and 416, ends 418 and 420, opposing chain mounting flanges 422 and 424, and a chain cavity 426 positioned between flanges 422 and 424 and bottom surfaces 428 of the PC board holder 400. Pairs of opposing gripper fingers 430–432 and 434–436 position in opposing configured V groove holes 438–440 and 442–444 as also illustrated in FIG. 10a.

Figure 10:
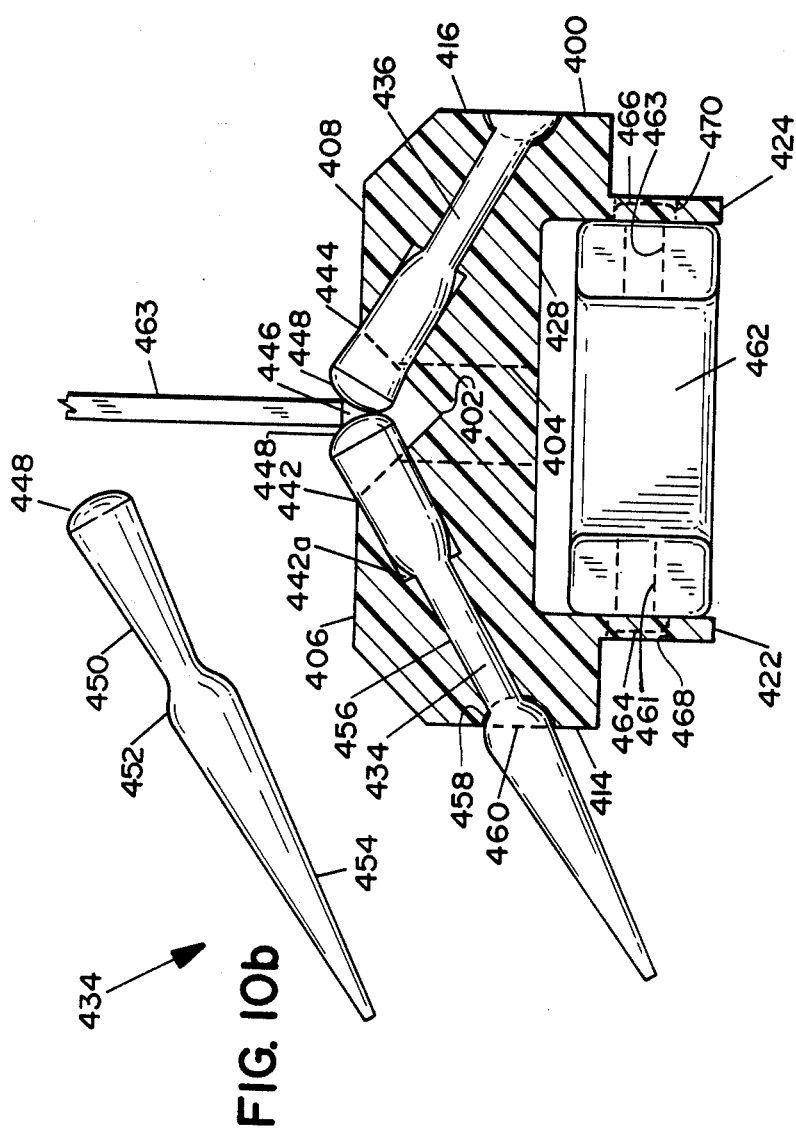
FIG. 10a illustrates a cross sectional view of the PC board holder taken along line 10a—10a of FIG. 9 and including a chain link and PC board.
FIG. 10b illustrates a plan view of an elastomer circuit board gripper.

FIG. 10a illustrates a cross-section of the PC board holder 400 taken along line 10a—10a of FIG. 9. A molded "40" durometer elastomer round configured gripper 434 illustrated in FIG. 10b positions in each of opposing configured holes 438-440 and 442-444 to form a V gripper pocket 446 as illustrated between like similar portions of the gripper heads 448. Any other like material such as a ethylene propylene can be utilized. Any durometer in the range of 20°-10° could be utilized with 4° durometer being preferred.

FIG. 10b illustrates the gripper 434 including a rounded gripper head 448, an upper decreasing diameter cylindrical shaft 450, a spherically shouldered gripper retainer member 452, and a lower decreasing diameter cylindrical shaft 454. The grippers 430, 432, 434 and 436 are similar to each other, but not described separately for sake of brevity. Likewise, the configured hole 442 is only described for the sake of brevity, and is similar to the holes 438, 440 and 444. The configured hole 442 is drilled at an angle through a face of the V groove 402. A relatively smaller hole 456 is coaxial to and aligned with hole 442. A semi spherical gripper retaining hole 458, somewhat similar to a counter sunk hole, in surface 414, aligns with and adjacent to small hole 456. The lower shaft 454 of gripper 434 is inserted into the hole 442, through the smaller hole 456 and a gripper retainer hole 458 in surface 414, and pulled with a nominal amount of force until the gripper 434 stretches enough to engage the spherical shouldered gripper retainer member 452 into and within the gripper retainer hole 458 as the gripper head 448 and upper decreasing diameter cylinder shaft 450 presses against and is restricted from further inward movement by the position against hole 442 and hole 442 affixing the gripper 434 within the PC board holder 400 as illustrated. The excess portion of the lower gripper shaft 454 is then trimmed flush to the surface 414 along a dashed line 460 as illustrated in FIG. 10a. A PC board 463 rests upon and in the V-pocket 446 as illustrated for carriage through the processing chambers. The size and depth of the V-pocket 446 may be varied by utilizing a shorter upper shaft 450, and/or varying the size and shape of the gripper head 448.

Figure 12:
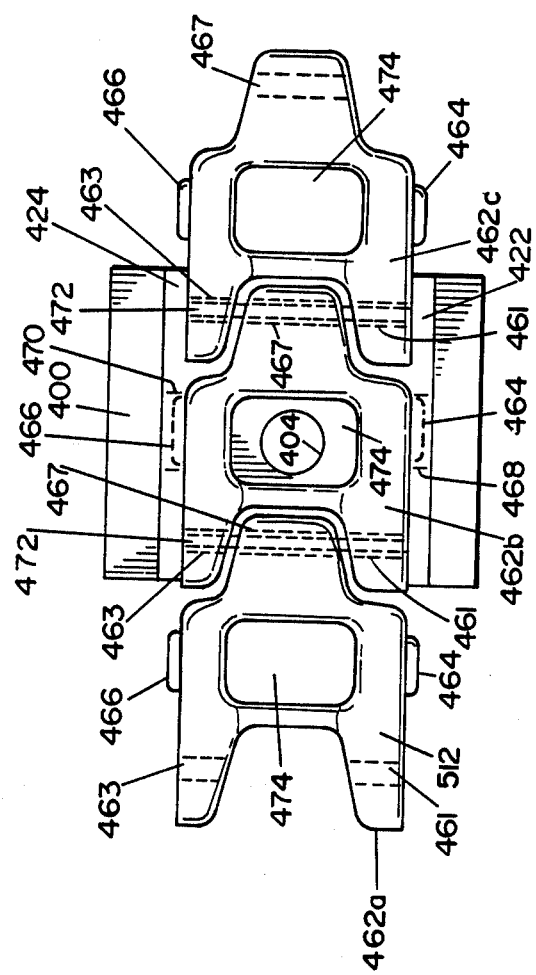
FIG. 12 illustrates a bottom view of the PC board holder engaged on a series of chain links or like members; and, FIG. 13 illustrates another alternate embodiment of a vertical photoresist developer system which separates into sections including conveyor cassettes.

A chain member 462 positions below the PC board holder 400 and between the flanges 422 and 424. Raised rounded portions 464 and 466 of the plastic non-corrosive chain member 462 positions in flange holes 468 and 470 respectively for fixation of the PC board holder 400 to the conveyor chain link 462 or like endless conveyor structure. Opposing holes 461 and 463 position as also illustrated in FIG. 12 in link member 462 as well as additional hole 467 at the opposite end of the link 462a as also illustrated in FIG. 12. A pin 472 driven through the opposing hole 463 of the link 462b, the hole 467 of the link 462a and the hole 461 of link 462b as illustrated in FIG. 12 secures the links to each other in a series forming endless chain conveyor 512. Sprocket drive holes 474 engage drive sprockets in conveyor cassettes 500 and 501 to drive conveyor chain 512 including a plurality of PC board holders 400. A series of PC board holders 400 snap over and onto the chain link members 462 at desired intervals by engaging the holes 468 and 470 of flanges 422 and 424 over and about the raised members 464-466 of chain link 462. Each link of the chain is in essence a master link. Any number of chain links maybe utilized as conveyor length demands to form endless conveyor chain 512 as described and illustrated in FIG. 12 and can be readily replaced individually if required. It would be deemed within the teachings of the disclosure that any type of endless conveyor structure could be utilized in lieu of the chain as disclosed.

Figure 11:
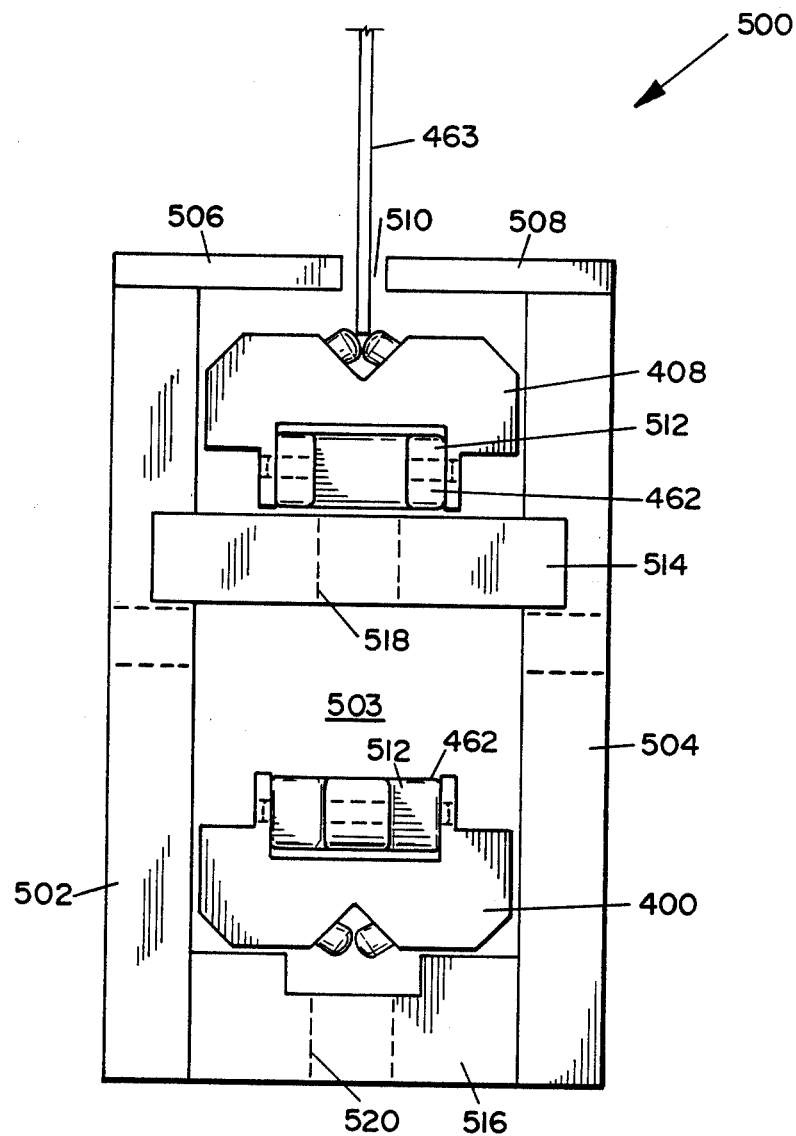
FIG. 11 illustrates an end view of conveyor cassette including PC board holders.

FIG. 11 illustrates an end view of the PC board holders and the conveyor chain in a conveyor cassette 500. The conveyor cassette 500 includes side rails 502 and 504, end wall 503, and cover and panel guides 506-508 which mount perpendicular to side rails 502-504 extending inwardly to form guide slot 510 between the ends of cover/guide 506 and 508 for insertion of a PC board 463 as illustrated and for resting upon a PC board holder 400. An upper chain ride support plate 514 positions between the side support rails 502 and 504 for support of the series linked conveyor chain 512 over long spans. A configured lower chain ride support plate 516 positions between the lower portions of the side rails 502 and 504. Both the upper and lower chain ride support plates 514 and 516 have drain holes 518 and 520 respectively positioned within for drainage of process chemicals and liquids from the conveyor chain 512.

FIG. 12 illustrates a bottom view of the PC board holder 400 engaged on a series of the chain links 512 where all numerals correspond to those previously described and where a plurality of individual links 462 secure to each other with the pin 472 driven through the holes 463, 467 and 461 to link each chain link 462 to each other as illustrated. Holes 468 and 470 in flanges 422 and 424 of the circuit board holder 400 secure over the raised members 464 and 466 to secure the holder 400 to an individual chain link 462 in endless conveyor chain series 512. Drain hole 404 positions aligned over the chain link drive hole 474 for efficient drainage of processing liquids. Any number of PC board holders 400 may be placed on the conveyor chain 512 either consecutively or at desired spacing intervals as required.

SECOND ALTERNATIVE EMBODIMENT

Figure 13:
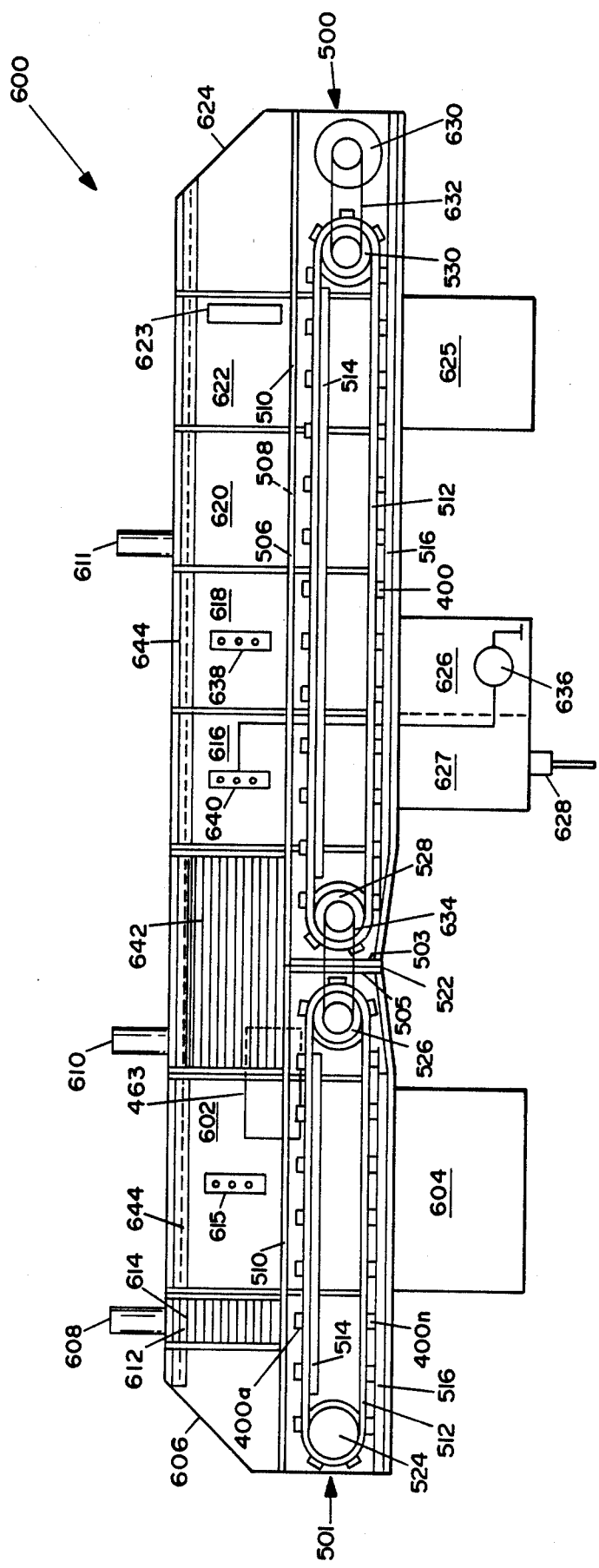

FIG. 13 illustrates a second alternate embodiment of an alternate photoresist structure separable developer system 600, including conveyor cassettes 500 and 501. The system 600 includes a separable vertical photoresist developer 600, are a developer chamber 602, developer sump 604, a conveyor cassette 501 including sprockets 524-526, a series linked conveyor chain 512 and a plurality of PC board holders 400a-400n positioned along conveyor chain 512, chain ride supports 514 and 516 and inlet guide 606. Power vents 608 and 610 position adjacent to develop chamber 602 and power vent 611 positions over rinse draining chamber 620 for removal of processing fumes or odors. A viewing port 612 and a plurality of horizontal guide lines 614 such as nylon or the like positions on each side of the longitudinal center line. A plurality of spray bars 615, wherein only one is shown for sake of brevity of illustration and similar to those disclosed in previously described figures positions in developer chamber 602. The other portion of separable photoresist etcher 600 of FIG. 13 is that portion to the right of the point 522 where the end walls 503 and 505 of cassettes 500 and 501 respectively meet. This is not construed to be limiting in nature as the end wall of each of the cassettes can be positioned at any or various points, and between any groups of the process chambers. This system includes a recirculating rinse chamber 616, fresh rinse chamber 618, viewing and rinse draining chamber 620, drying chamber 622, air knives 623, outlet guide bars 624 and the conveyor cassette 500 similar to the conveyor cassette 501. The system includes sprockets 528 and 530 wherein a motor 630 and a drive chain 632 drives sprocket 530 which in turn drives sprocket 528 through motion of the plastic chain 512, drive chain 634 and ultimately the driven members of cassette 501. Blower housing 625, fresh rinse chamber sump 626, recirculating rinse chamber sump 627 and a drain 628 position as illustrated beneath their respective chambers. A pump 636 in sump 626 pumps water from the represented plurality of fresh spray bars 638 in sump 626 to the representative plurality of recirculating spray bars 640 which flows overboard through sump 627 and drain 628. A plurality of horizontal guide lines 642 position on both sides of the longitudinal center line between develop chamber 602 and the recirculating rinse chamber 616 to guide the vertically placed circuit board 463 from the develop chamber 602 to the rinse chamber 616. A printed circuit board passes from a PC board holder 400 of aligned conveyor 501 to the PC board holder 400 of aligned conveyor 500 for processing. A two piece channeled center guide bar 644 positions at the top and through the chambers for additional support of a large circuit board or of a large circuit board carrier containing a plurality of small circuit boards or board therein.

Various modifications can be made to the present invention without departing from the apparent scope thereof.

We claim:

1. Printed circuit board chemical in line processing system comprising:
   a. load station;
   b. an inlet chamber;
   c. main chamber including a liquid sump;
   d. rinse chamber;
   e. drying chamber;
   f. an outlet chamber;
   g. unload station;
   h. an endless chain means extending through said load stations and said chambers, and housing means supporting each of said chambers and stations;
   i. substantially horizontally positioned fluid dispensing nozzles in said main, rinse, and driving chambers;
   j. means for electromechanically controlling flow and time of flow of fluid through said main, rinse, and drying chambers; and,
   k. at least one process cassette for engaging with said chain means and for accepting a printed circuit board for processing through each of said stations and said chambers, said process cassette including a substantially rectangular housing with a longitudinal V groove parallel to said endless chain means on a top side thereof, securing means on a bottom side thereof for securing to said endless chain means, and at least two opposing finger means extending outwardly with respect to each other of an opposing sides of said V groove.

2. System of claim 1 wherein said main chamber includes a plurality of opposed aligned spray tubes.

3. System of claim 1 wherein said rinse chamber includes a plurality of opposed aligned spray tubes.

4. System of claim 1 wherein said drying chamber includes means for air flow.

5. System of claim 1 wherein each of said chambers include divider seal means.

6. System of claim 1 including control means for regulating temperature control of fluid and for regulating fluid flow through said chambers.

7. System of claim 6 including means to measure temperature of said fluid and visual readout means connected to said measuring means.

8. System of claim 6 including warning means for low fluid level and low temperature level of said fluid.

9. System of claim 6 wherein said control means is mounted on a lower portion of said housing means.

10. System of claim 6 including means for filtering said fluid.

11. System of claim 1 including means for externally venting undesirable vapors and fumes.

12. System of claim 1 including knife means air dryers.

13. System of claim 1 including means separating each of said chambers and said stations.

14. The printed circuit board holder of claim 1 wherein each of said finger means are of a elastomer material.

15. The printed circuit board holder of claim 1 wherein said grippers form a V-pocket.

16. The printed circuit board holder of claim 1 wherein each of said finger means secure within a retainer hole in said housing.

* * * * *